(12) United States Patent
Choi et al.

(10) Patent No.: US 9,864,272 B2
(45) Date of Patent: *Jan. 9, 2018

(54) PHOTOSENSITIVE RESIN COMPOSITION FOR COLOR FILTER, AND COLOR FILTER USING THE SAME

(71) Applicant: Samsung SDI Co., Ltd., Yongin-si (KR)

(72) Inventors: Se-Young Choi, Uiwang-si (KR); Nam-Gwang Kim, Uiwang-si (KR); Kyung-Hee Hyung, Uiwang-si (KR); Gyu-Seok Han, Uiwang-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 473 days.

This patent is subject to a terminal disclaimer.

(21) Appl. No.: 13/972,277

(22) Filed: Aug. 21, 2013

(65) Prior Publication Data

US 2014/0158953 A1    Jun. 12, 2014

(30) Foreign Application Priority Data

Dec. 7, 2012 (KR) .................. 10-2012-0142104

(51) Int. Cl.
*G02B 5/23* (2006.01)
*G03F 7/00* (2006.01)

(52) U.S. Cl.
CPC .................. *G03F 7/0007* (2013.01)

(58) Field of Classification Search
USPC ....................... 252/586; 430/270.1
See application file for complete search history.

(56) References Cited

U.S. PATENT DOCUMENTS

| | | |
|---|---|---|
| 3,030,347 A | 4/1962 | O'Brien et al. |
| 3,985,831 A | 10/1976 | Boyer |
| 4,409,350 A | 10/1983 | Fujiwara et al. |
| 5,190,845 A | 3/1993 | Hashimoto et al. |
| 5,278,009 A | 1/1994 | Iida et al. |
| 5,292,817 A | 3/1994 | Grey et al. |
| 5,663,019 A | 9/1997 | Matsumura et al. |
| 5,773,533 A | 6/1998 | Horold |
| 5,812,209 A | 9/1998 | Nishigaki |
| 5,827,626 A | 10/1998 | Kobayashi et al. |
| 5,876,895 A | 3/1999 | Hishiro et al. |
| 5,998,091 A | 12/1999 | Suzuki |
| 6,096,852 A | 8/2000 | Lensvelt et al. |
| 6,624,250 B2 | 9/2003 | Zimmerman |
| 6,632,891 B1 | 10/2003 | Tada et al. |
| 7,763,402 B2 | 7/2010 | Cho et al. |
| 7,863,382 B2 | 1/2011 | Ishii et al. |
| 8,293,149 B2 | 10/2012 | Lee et al. |
| 8,486,591 B2 | 7/2013 | Jeong et al. |

(Continued)

FOREIGN PATENT DOCUMENTS

| | | |
|---|---|---|
| CN | 1121083 A | 4/1996 |
| CN | 1717425 A | 1/2006 |

(Continued)

OTHER PUBLICATIONS

Search Report in counterpart Taiwanese Application No. 102128847 dated Oct. 17, 2014, pp. 1.

(Continued)

*Primary Examiner* — Monique R Peets
(74) *Attorney, Agent, or Firm* — Additon, Higgins & Pendleton, P.A.

(57) ABSTRACT

Disclosed are a photosensitive resin composition for a color filter including (A) an acrylic-based binder resin including at least one repeating unit represented by the following Chemical Formula 1, at least one repeating unit represented by the following Chemical Formula 2 and at least one repeating unit represented by the following Chemical Formula 3, (B) a photopolymerizable monomer, (C) a photopolymerization initiator, (D) a colorant, and (E) a solvent, and a color filter using the same.

[Chemical Formula 1]

[Chemical Formula 2]

[Chemical Formula 3]

In the above Chemical Formulae 1 to 3, each substituent is the same as defined in the detailed description.

12 Claims, 2 Drawing Sheets

(56) References Cited

U.S. PATENT DOCUMENTS

| 8,735,025 | B2 | 5/2014 | Kim et al. | |
|---|---|---|---|---|
| 9,005,491 | B2* | 4/2015 | Lee | G03F 7/033 204/192.15 |
| 2002/0115761 | A1 | 8/2002 | Eckel et al. | |
| 2002/0172873 | A1 | 11/2002 | Ueda et al. | |
| 2007/0145338 | A1 | 6/2007 | Zakikhani | |
| 2008/0242795 | A1 | 10/2008 | Jang et al. | |
| 2010/0152357 | A1 | 6/2010 | Kwon et al. | |
| 2010/0160474 | A1 | 6/2010 | Lee et al. | |
| 2010/0240831 | A1 | 9/2010 | Kim et al. | |
| 2010/0256288 | A1 | 10/2010 | Kim et al. | |
| 2011/0009524 | A1 | 1/2011 | Kwon et al. | |
| 2011/0160400 | A1 | 6/2011 | Lee et al. | |
| 2013/0001483 | A1 | 1/2013 | Lee et al. | |
| 2013/0234084 | A1 | 9/2013 | Chung et al. | |

FOREIGN PATENT DOCUMENTS

| CN | 101464631 A | 6/2009 |
|---|---|---|
| CN | 101497630 A | 8/2009 |
| CN | 101512435 A | 8/2009 |
| CN | 101747610 A | 6/2010 |
| CN | 101805567 A | 8/2010 |
| CN | 102167770 A | 8/2011 |
| CN | 102854749 A | 1/2013 |
| EP | 0319971 A2 | 6/1989 |
| EP | 0628599 A1 | 12/1994 |
| EP | 0663410 A1 | 7/1995 |
| EP | 0725315 B1 | 5/2001 |
| EP | 1739109 A1 | 1/2007 |
| EP | 2657292 A1 | 10/2013 |
| JP | 02-70712 A | 3/1990 |
| JP | 7-140654 A | 6/1995 |
| JP | 08-262707 A | 10/1996 |
| JP | 10-010719 A | 1/1998 |
| JP | 10-254133 A | 9/1998 |
| JP | 11-092964 A | 4/1999 |
| JP | 2000-075501 A | 3/2000 |
| JP | 2000-305262 A | 11/2000 |
| JP | 2002-244287 A | 8/2002 |
| JP | 2006-257126 A | 9/2006 |
| JP | 2008-298938 A | 12/2008 |
| JP | 2009-091458 * | 4/2009 |
| JP | 2011-191609 A | 9/2011 |
| JP | 2011-257590 A | 12/2011 |
| KR | 10-1980-0001251 B1 | 10/1980 |
| KR | 1991-0004717 B1 | 7/1991 |
| KR | 1992-7002502 | 9/1992 |
| KR | 1993-7000858 | 3/1993 |
| KR | 1994-0005617 B1 | 6/1994 |
| KR | 1994-0007778 B1 | 8/1994 |
| KR | 1995-7000359 | 1/1995 |
| KR | 1995-0011163 B1 | 9/1995 |
| KR | 1995-7003746 A | 9/1995 |
| KR | 1996-11513 A | 4/1996 |
| KR | 1996-0029904 | 8/1996 |
| KR | 10-0163016 B1 | 9/1998 |
| KR | 10-0153323 B1 | 11/1998 |
| KR | 10-2001-0052338 A | 6/2001 |
| KR | 10-2004-0031227 A | 4/2004 |
| KR | 10-0817563 B1 | 3/2008 |
| KR | 10-0832518 B1 | 5/2008 |
| KR | 10-2006-0111178 | 8/2008 |
| KR | 10-2008-0089122 A | 10/2008 |
| KR | 10-0885819 B1 | 2/2009 |
| KR | 10-2009-0024561 A | 3/2009 |
| KR | 10-2009-0038191 A | 4/2009 |
| KR | 10-2009-0066204 A | 6/2009 |
| KR | 10-2009-0066242 A | 6/2009 |
| KR | 10-2009-0072754 A | 7/2009 |
| KR | 10-0910829 B1 | 8/2009 |
| KR | 10-2009-0106226 A | 10/2009 |
| KR | 10-2010-0003531 A | 1/2010 |
| KR | 10-2010-0049458 A | 5/2010 |
| KR | 10-2010-0098882 A | 9/2010 |
| KR | 10-2011-0076490 A | 7/2011 |
| KR | 10-2011-0076495 A | 7/2011 |
| KR | 10-2011-0077881 A | 7/2011 |
| KR | 10-2011-0078238 A | 7/2011 |
| KR | 1020110076490 * | 7/2011 |
| KR | 10-2012-0049785 | 5/2012 |
| KR | 1020120049785 * | 5/2012 |
| TW | 406214 B | 9/2000 |
| TW | 2009-03044 A | 1/2009 |
| TW | 200916955 A | 4/2009 |
| TW | 201030461 A | 8/2010 |
| WO | 89/01186 | 9/1989 |
| WO | 91/20006 | 12/1991 |
| WO | 92/14172 | 8/1992 |
| WO | 94/14892 | 7/1994 |
| WO | 95/02839 | 1/1995 |
| WO | 99/58593 A1 | 11/1999 |
| WO | 2008/120854 A1 | 10/2008 |
| WO | 2009/116722 A1 | 9/2009 |
| WO | 2012/015128 A1 | 2/2012 |
| WO | 2012/060514 A1 | 5/2012 |
| WO | 2012/060515 A1 | 5/2012 |
| WO | 2012/081761 A1 | 6/2012 |

OTHER PUBLICATIONS

English Translation of Search Report in counterpart Taiwanese Application No. 102128847 dated Oct. 17, 2014, pp. 1.
Search Report in counterpart Chinese Application No. 201310341727.1 dated Apr. 25, 2016, pp. 1-2.
Search Report in counterpart Chinese Application No. 201310341727.1 dated Apr. 6, 2017, pp. 1-2.
Office Action in commonly owned U.S. Appl. No. 12/966,133 dated Jan. 3, 2013, pp. 1-20.
Ebdon et al., "Thermal degradation and flame retardance in copolymers of methyl methacrylate with diethyl (methacryloyloxymethyl)phosphonate", September-December edition of Polymer Degradation and Stability, vol. 70, 2000, pp. 425-436.
UL IDES properties for PMMA, downloaded from http://plastics.ides.com/generics/3/c/t/acrylic-acrylic-properties-processing on Dec. 19, 2012, pp. 1-4.
Office Action in commonly owned U.S. Appl. No. 13/190,979 dated Feb. 16, 2012, pp. 1-10.
Notice of Allowance in commonly owned U.S. Appl. No. 13/190,979 dated Jun. 19, 2012, pp. 1-10.
Search Report in commonly owned Chinese Application No. 201210007804.5 dated Dec. 1, 2013, pp. 1-4.
Office Action dated Nov. 22, 2013, in commonly owned Taiwanese Patent Application No. 101103253, pp. 1-3.
Search Report dated Nov. 21, 2013, in commonly owned Taiwanese Patent Application No. 101103253, p. 1.
Price, et al. "Flame retarding poly(methyl methacrylate) with phosphorous-containing compounds: comparison of an additive with a reactive approach" Polymer Degradation and Stability, 74, (2001) 441-447.
Office Action in commonly owned U.S. Appl. No. 13/353,710 dated Feb. 1, 2013, pp. 1-24.
Final Office Action in commonly owned U.S. Appl. No. 13/353,710 dated May 17, 2013, pp. 1-14.
Notice of Allowance in commonly owned U.S. Appl. No. 13/353,710 dated Sep. 5, 2013, pp. 1-12.
Office Action in commonly owned U.S. Appl. No. 13/353,710 dated Apr. 28, 2014, pp. 1-15.
Canniccioni et al., Polymerization of a Phosphonated Methacrylate Via Raft Living Radical Polymerization, Proceedings Published 2011 by the American Chemical Society, 52(2), 645-646.
Notice of Allowance in commonly owned U.S. Appl. No. 13/353,710 dated Aug. 14, 2014, pp. 1-14.
Notice of Allowance in commonly owned U.S. Appl. No. 13/353,710 dated Dec. 10, 2014, pp. 1-13.
Search Report in counterpart Chinese Application No. 201310341727.1 dated Dec. 5, 2016, pp. 1-2.

(56) References Cited

OTHER PUBLICATIONS

International Search Report in counterpart International Application No. PCT/KR2010/009539 dated Jan. 18, 2012, pp. 1-6.
Notice of Allowance in commonly owned U.S. Appl. No. 13/872,240 dated Aug. 20, 2014, pp. 1-9.
Office Action in commonly owned Chinese Application No. 201080070671.5 dated Mar. 5, 2014, pp. 1-6.
Office Action in commonly owned Korean Application No. 10-2010-0127795 dated Aug. 7, 2013, pp. 1-14.
International Search Report in commonly owned International Application No. PCT/KR2010/009538 dated Sep. 16, 2011, pp. 1-4.
Price et al., "Ignition temperatures and pyrolysis of a flame-retardant methyl methacrylate copolymer containing diethyl (methacryloyloxymethyl)-phosphonate units", Polymer International, Oct. 5, 2000, vol. 49, pp. 1164-1168.
Korean Office Action in commonly owned Korean Application No. 10-2010-0109988 dated Jun. 19, 2013, pp. 1-5.
Chinese Office Action in commonly owned Chinese Application No. 201080070004.7 dated Feb. 19, 2014, pp. 1-7.
English-translation of Chinese Office Action in commonly owned Chinese Application No. 201080070004.7 dated Feb. 19, 2014, pp. 1-7.
Hong et al., "Preparation and Properties of Flame Retardant Acrylate Rubber," China Synthetic Rubber Industry, vol. 23, No. 02, pp. 92-94.
Jin et al., "Polyacrylates Flame Retardants," Chinese Journal of Colloid & polymer, vol. 19, No. 4, pp. 41-43, 2001.
International Search Report in commonly owned International Application No. PCT/KR2010/009533 dated Dec. 19, 2011, pp. 1-2.
Office Action in commonly owned U.S. Appl. No. 13/872,240 dated Feb. 24, 2014, pp. 1-8.
Office Action in commonly owned U.S. Appl. No. 13/740,335 dated Sep. 18, 2014, pp. 1-20.
Extended European Search Report in commonly owned European Application No. 10855400 dated Nov. 15, 2013, pp. 1-6.
Office Action in commonly owned U.S. Appl. No. 13/914,856 dated Oct. 14, 2014, pp. 1-10.
International Search Report in commonly owned International Application No. PCT/KR2010/009532 dated Dec. 19, 2011, pp. 1-2.
Korean Office Action in commonly owned Korean Application No. 10-2010-0109991 dated Apr. 12, 2013, pp. 1-6.
Final Office Action in commonly owned U.S. Appl. No. 12/966,133 dated Jun. 28, 2013, pp. 1-23.
Price et al., "Flame retardance of poly(methyl methacrylate) modified with phosphorus-containing compounds", Polymer Degradation and Stability, vol. 77, (2002) pp. 227-233.

* cited by examiner

PHOTOSENSITIVE RESIN COMPOSITION FOR COLOR FILTER, AND COLOR FILTER USING THE SAME

CROSS-REFERENCE TO RELATED APPLICATIONS

This application claims priority to and the benefit of Korean Patent Application No. 10-2012-0142104 filed in the Korean Intellectual Property Office on Dec. 7, 2012, the entire disclosure of which is incorporated herein by reference.

FIELD

This disclosure relates to a photosensitive resin composition for a color filter and a color filter using the same.

BACKGROUND

Color filters are used for liquid crystal displays (LCDs), optical filters for cameras, and the like. Color filters may be manufactured by coating a fine region colored with three or more colors on a charge coupled device or a transparent substrate. This colored thin film can be manufactured using various methods such as dyeing, printing, electrophoretic deposition (EPD), pigment dispersion, and the like.

The dyeing method forms a colored film by forming an image with a dyeing agent on a substrate, and then dyeing the image with direct dyes. Examples of the dyeing agent useful in the manufacture of colored thin films include natural photosensitive resins such as gelatin and the like, amine-modified polyvinyl alcohols, amine-modified acrylic-based resins, and the like. However, the dyeing process may be complex and lengthy, since it should include resist printing whenever a color needs to be changed to form a multi-colored thin film on the same substrate. In addition, many generally-used dyes and resins may have good color vividness and dispersion, but may also have poor color fastness, water resistance, and heat resistance, which are very important characteristics. For example, Korean Patent Nos. 1991-0004717 and 1994-0007778 include azo and azide compounds as a dye, which have deteriorated heat resistance and durability compared with a pigment.

The printing method forms a colored thin film by printing an ink prepared by dispersing a pigment into a thermally curable or photocurable resin and curing it with heat or light. This method may decrease material costs compared with other methods, but it is difficult to form a fine and precise image and acquire a uniform thin film layer. Korean Patent Laid-Open Publication Nos. 1995-7003746 and 1996-11513 disclose a method of making a color filter using an inkjet method. However, the resultant color filter suffers similar problems to a color filter made using dyeing techniques, such as deteriorated durability and heat resistance, because a dye-type color resist composition is also used and dispersed from a nozzle to accomplish fine and precise color printing in this inkjet printing method.

Korean Patent Laid-Open Publication Nos. 1993-7000858 and 1996-0029904 disclose electrophoretic deposition (EPD) in an electric precipitation method. The electrophoretic deposition (EPD) may form a precise color film having excellent heat resistance and color fastness, since it uses a pigment. However, this method may not be applied to a highly precise color filter requiring a finer electrode pattern for a more precise pixel in the future, because it may produce a colored film that is stained or thicker at both ends due to electrical resistance.

The pigment dispersion method forms a colored film by repeating a series of processes such as coating, exposing to light, developing, and curing a photopolymer composition including a coloring agent on a transparent substrate including a light-blocking layer (black matrix). This method may improve heat resistance and durability, which are very important characteristics for a color filter, and may provide a uniform film thickness. For example, Korean Patent Laid-Open Publications No. 1992-7002502, Korean Patent Nos. 1994-0005617, and 1995-0011163, Korean Patent Laid-Open Publication No. 1995-7000359, and the like disclose a method of making a color resist in a pigment dispersion method.

In this pigment dispersion method, a photosensitive resin composition for a color filter generally includes a binder resin, a photopolymerization monomer, a photopolymerization initiator, an epoxy resin, a solvent, and other additives. For example, the binder resin may include a carboxyl-containing acrylic-based copolymer, as in Japanese Patent Laid-Open Publications Pyung 7-140654 and 10-254133.

In particular, color filters have recently been manufactured in a consecutive process for mass production. In addition, the color filters have been manufactured by using a coloring photosensitive resin composition having a pigment particle diameter for high quality, and accordingly, a photosensitive resin composition having a wide process margin is required. However, the coloring photosensitive resin composition can lower process yield, since a resist in a non-exposed region may not be completely removed during formation of a fine pattern for a color filter or a pattern can be unsatisfactorily formed, which requires a color photoresist having excellent development characteristics.

SUMMARY

One embodiment provides a photosensitive resin composition for a color filter that can have high luminance and high contrast ratio and thereby improved color characteristics, developability, and chemical resistance.

Another embodiment provides a color filter manufactured using the photosensitive resin composition.

One embodiment a photosensitive resin composition for a color filter that includes (A) an acrylic-based binder resin including at least one repeating unit represented by the following Chemical Formula 1, at least one repeating unit represented by the following Chemical Formula 2 and at least one repeating unit represented by the following Chemical Formula 3; (B) a photopolymerizable monomer; (C) a photopolymerization initiator; (D) a colorant; and (E) a solvent.

[Chemical Formula 1]

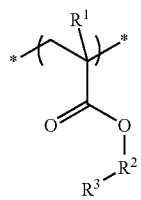

-continued

[Chemical Formula 2]

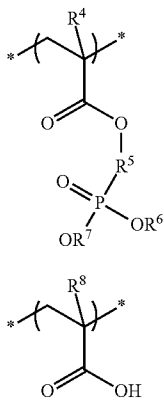

[Chemical Formula 3]

In the above Chemical Formulae 1 to 3, $R^1$, $R^4$ and $R^8$ are the same or different and are each independently hydrogen or substituted or unsubstituted C1 to C10 alkyl, $R^2$ and $R^5$ are the same or different and are each independently a single bond or substituted or unsubstituted C1 to C10 alkylene, $R^3$ is substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted epoxy, and $R^6$ and $R^7$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl.

The repeating unit represented by the above Chemical Formula 1 may include a first repeating unit wherein $R^3$ is substituted or unsubstituted C3 to C20 cycloalkyl, a second repeating unit wherein $R^3$ is substituted or unsubstituted C6 to C30 aryl, and a third repeating unit wherein $R^3$ is substituted or unsubstituted epoxy.

The acrylic-based binder resin may include about 65 to about 80 mol % of the repeating unit represented by the above Chemical Formula 1, about 5 to about 15 mol % of the repeating unit represented by the above Chemical Formula 2, and about 15 to about 25 mol % of the repeating unit represented by the above Chemical Formula 3.

The acrylic-based binder resin may include repeating units represented by the following Chemical Formulae 4 to 8.

[Chemical Formula 4]

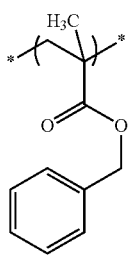

[Chemical Formula 5]

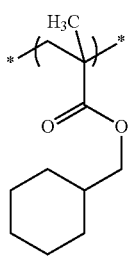

[Chemical Formula 6]

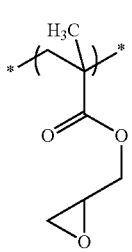

[Chemical Formula 7]

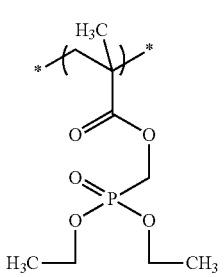

[Chemical Formula 8]

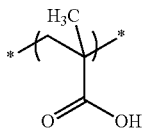

The acrylic-based binder resin may include a structural unit represented by the following Chemical Formula 9.

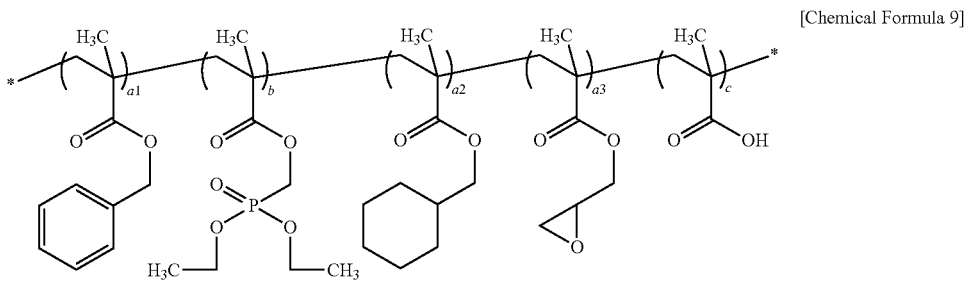

[Chemical Formula 9]

In the above Chemical Formula 9,
$a^1$, $a^2$, $a^3$, b, and c are the same or different and are each independently integers ranging from 1 to 50.

The acrylic-based binder resin may have a weight average molecular weight of about 6,000 to about 15,000 g/mol.

The colorant may include a dye, a pigment, or a combination thereof.

The photosensitive resin composition for a color filter may include about 1 to about 40 wt % of the acrylic-based binder resin (A); about 1 to about 30 wt % of the photopolymerizable monomer (B); about 0.1 to about 10 wt % of the photopolymerization initiator (C); about 1 to about 40 wt % of the colorant (D); and a balance amount of the solvent (E).

The photosensitive resin composition for a color filter may further include at least one additive selected from malonic acid; 3-amino-1,2-propanediol; a silane-based coupling agent having a vinyl group or a (meth)acryloxy group; a leveling agent; a fluorine-based surfactant; and a radical polymerization initiator.

Another embodiment provides a color filter using the photosensitive resin composition for a color filter.

Other embodiments are included in the following detailed description.

The photosensitive resin composition for a color filter can have high light transmittance and durability, and a color filter having high luminance, high contrast ratio, and improved developability and chemical resistance may be realized.

DETAILED DESCRIPTION

Figure 1:
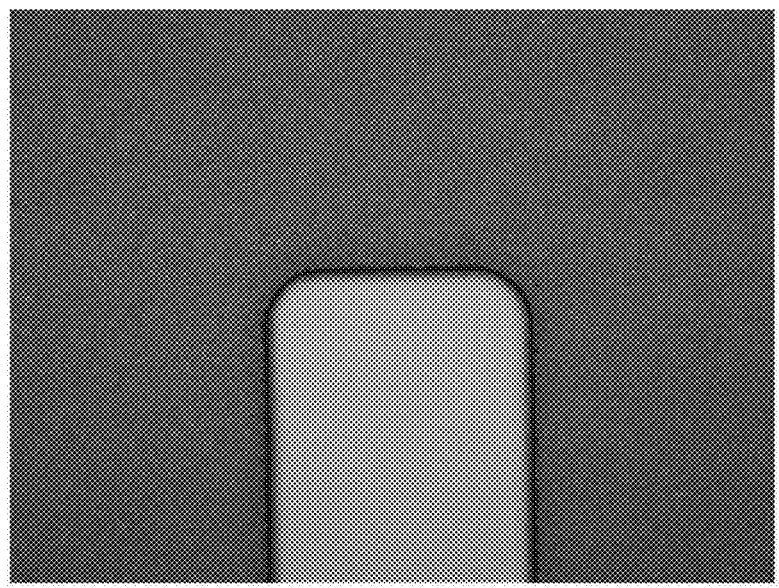
FIG. 1 is an optical microscope photograph of the color filter according to Example 1 after a development process.

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" may refer to one substituted with a substituent including halogen (F, Cl, Br, or I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof, instead of at least one hydrogen.

As used herein, when a specific definition is not otherwise provided, the term "hetero" may refer to a cyclic compound substituted with at least one hetero atom of N, O, S, P, or a combination thereof, instead of at least one C (carbon atom) in a cyclic compound.

As used herein, when a specific definition is not otherwise provided, "(meth)acrylate" refers to "acrylate" and "methacrylate", and "(meth)acrylic acid" refers to "acrylic acid" and "methacrylic acid".

A photosensitive resin composition for a color filter according to one embodiment includes (A) an acrylic-based binder resin, (B) a photopolymerizable monomer, (C) a photopolymerization initiator, (D) a colorant, and (E) a solvent.

Hereinafter, each component is described in detail.

(A) Acrylic-Based Binder Resin

The acrylic-based binder resin may include at least one repeating unit represented by the following Chemical Formula 1, at least one repeating unit represented by the following Chemical Formula 2, and at least one repeating unit represented by the following Chemical Formula 3.

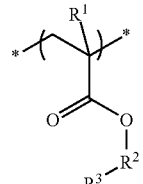

[Chemical Formula 1]

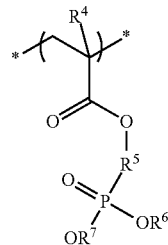

[Chemical Formula 2]

-continued

[Chemical Formula 3]

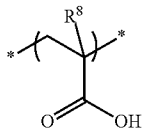

In the above Chemical Formulae 1 to 3, $R^1$, $R^4$, and $R^5$ are the same or different and are each independently hydrogen or substituted or unsubstituted C1 to C10 alkyl, $R^2$ and $R^5$ are the same or different and are each independently a single bond or substituted or unsubstituted C1 to C10 alkylene, $R^3$ is substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, substituted or unsubstituted C6 to C30 aryl, or substituted or unsubstituted epoxy, and $R^6$ and $R^7$ are the same or different and are each independently substituted or unsubstituted C1 to C20 alkyl, substituted or unsubstituted C2 to C20 alkenyl, substituted or unsubstituted C2 to C20 alkynyl, substituted or unsubstituted C3 to C20 cycloalkyl, substituted or unsubstituted C3 to C20 cycloalkenyl, substituted or unsubstituted C3 to C20 cycloalkynyl, or substituted or unsubstituted C6 to C30 aryl.

In the above Chemical Formula 1, $R^3$ may be substituted or unsubstituted C3 to C20 cycloalkyl, substituted or unsubstituted C6 to C30 aryl, and/or substituted or unsubstituted epoxy.

The repeating unit represented by the above Chemical Formula 1 may include a first repeating unit wherein $R^3$ is substituted or unsubstituted C3 to C20 cycloalkyl, a second repeating unit wherein $R^3$ is substituted or unsubstituted C6 to C30 aryl, and/or a third repeating unit wherein $R^3$ is substituted or unsubstituted epoxy.

The acrylic-based binder resin may include the repeating unit represented by the above Chemical Formula 1 in an amount of about 65 to about 80 mol %, for example about 70 to about 75 mol % based on the total amount (total mol %) of the acrylic-based binder resin. In some embodiments, the acrylic-based binder resin may include the repeating unit represented by the above Chemical Formula 1 in an amount of about 65, 66, 67, 68, 69, 70, 71, 72, 73, 74, 75, 76, 77, 78, 79, or 80 mol %. Further, according to some embodiments of the present invention, the amount of the repeating unit represented by the above Chemical Formula 1 can be in a range from about any of the foregoing amounts to about any other of the foregoing amounts.

Within the above range, excellent pattern-forming capability and improved mechanical strength of a film may be provided.

The acrylic-based binder resin may include the repeating unit represented by the above Chemical Formula 2 in an amount of about 5 to about 15 mol %, for example about 7 to about 12 mol % based on the total amount (total mol %) of the acrylic-based binder resin. In some embodiments, the acrylic-based binder resin may include the repeating unit represented by the above Chemical Formula 2 in an amount of about 5, 6, 7, 8, 9, 10, 11, 12, 13, 14, or 15 mol %. Further, according to some embodiments of the present invention, the amount of the repeating unit represented by the above Chemical Formula 2 can be in a range from about any of the foregoing amounts to about any other of the foregoing amounts.

Within the above range, a photosensitive resin composition for a color filter having high light transmittance and excellent durability may be provided.

The acrylic-based binder resin may include the repeating unit represented by the above Chemical Formula 3 in an amount of 15 to 25 mol %, for example 18 to 22 mol % based on the total amount (total mol %) of the acrylic-based binder resin. In some embodiments, the acrylic-based binder resin may include the repeating unit represented by the above Chemical Formula 3 in an amount of about 15, 16, 17, 18, 19, 20, 21, 22, 23, 24, or 25 mol %. Further, according to some embodiments of the present invention, the amount of the repeating unit represented by the above Chemical Formula 3 can be in a range from about any of the foregoing amounts to about any other of the foregoing amounts.

Within the above ranges, the acrylic-based binder resin may have an appropriate acid value and thus developability for an alkali developing solution can be improved.

The acrylic-based binder resin includes at least one repeating unit represented by the following Chemical Formula 1, at least one repeating unit represented by the following Chemical Formula 2 and at least one repeating unit represented by the following Chemical Formula 3, and thereby yellowing of the binder resin may be prevented. When the acrylic-based binder resin is used in a photosensitive resin composition for a color filter, a color filter having high luminance and high contrast ratio, and excellent developability, durability, and chemical resistance may be provided.

Each repeating unit represented by above Chemical Formula 1 to 3 may be a random copolymer as well as block and alternating copolymers.

The acrylic-based binder resin may specifically include repeating units represented by the following Chemical Formulae 4 to 8.

[Chemical Formula 4]

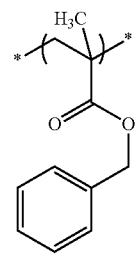

[Chemical Formula 5]

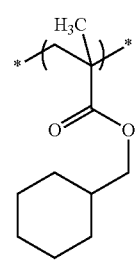

[Chemical Formula 6]

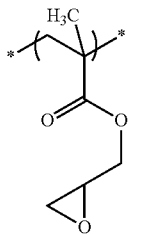

[Chemical Formula 7]

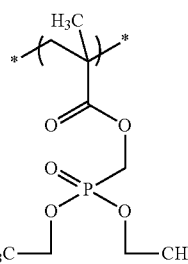

[Chemical Formula 8]

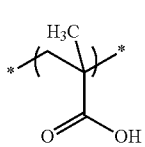

The acrylic-based binder resin may most specifically include a structural unit represented by the following Chemical Formula 9.

[Chemical Formula 9]

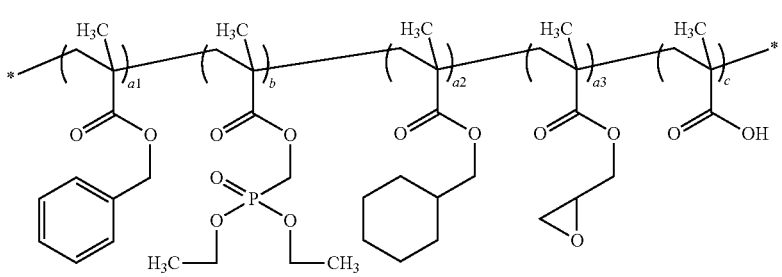

In the above Chemical Formula 9,
$a^1$, $a^2$, $a^3$, b, and c are the same or different and are each independently integers ranging from 1 to 50.

The acrylic-based binder resin may have a weight average molecular weight of about 6,000 to about 15,000 g/mol, for example about 8,000 to about 10,000 g/mol. Within the above range of the weight average molecular weight, developability for an alkali developing solution may be improved, and pigment dispersion may be stabilized.

The acrylic-based binder resin may have an acid value of about 90 to about 200 mgKOH/g, for example about 110 to about 140 mgKOH/g. Within the above ranges of the acid value, developability for an alkali developing solution can be improved and thus a pattern of a color filter may be easily formed.

The photosensitive resin composition may include the acrylic-based binder resin in an amount of about 1 to about 40 wt %, for example about 5 to about 30 wt %, based on the total amount (total weight) of the photosensitive resin composition for a color filter. In some embodiments, the photosensitive resin composition may include the acrylic-based binder resin in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the acrylic-based binder resin can be in a range from about any of the foregoing amounts to about any other of the foregoing amounts.

When the acrylic-based binder resin is included in an amount within the above range, developability for an alkali developing solution, thickness uniformity, surface roughness, and close-contacting (adhesive) properties may be improved.

(B) Photopolymerizable Monomer

The photopolymerizable monomer may be a monofunctional and/or multi-functional ester of (meth)acrylic acid including at least one ethylenic unsaturated double bond.

The photopolymerizable monomer performs sufficient polymerization during exposure of a pattern-forming process due to the ethylenic unsaturated double bond, and a pattern having heat resistance, light resistance, and chemical resistance may be provided.

Examples of the photopolymerizable monomer may include without limitation ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like, and combinations thereof.

Commercially available examples of the photopolymerizable monomer are as follows. Examples of the monofunctional (meth)acrylic acid ester may include without limitation Aronix M-101®, M-111®, M-114® (TOAGOSEI CHEMICAL INDUSTRY CO., LTD.); KAYARAD TC-110S®, TC-120S® (NIPPON KAYAKU CO., LTD.); V-158®, V-2311® (OSAKA ORGANIC CHEMICAL IND., LTD.), and the like. Examples of a difunctional (meth) acrylic acid ester may include without limitation Aronix M-210®, M-240®, M-6200® (TOAGOSEI CHEMICAL INDUSTRY CO., LTD.), KAYARAD HDDA®, HX-220®, R-604® (NIPPON KAYAKU CO., LTD.), V-260®, V-312®, V-335 HP® (OSAKA ORGANIC CHEMICAL IND., LTD.), and the like. Examples of a tri-functional (meth)acrylic acid ester may include without limitation Aronix M-309®, M-400®, M-405®, M-450®, M-7100®, M-8030®, M-8060® (TOAGOSEI CHEMICAL INDUSTRY CO., LTD.), KAYARAD TMPTA®, DPCA-20®, DPCA-30®, DPCA-60®, DPCA-120® (NIPPON KAYAKU CO., LTD.), V-295®, V-300®, V-360®, V-GPT®, V-3PA®, V-400® (Osaka Yuki Kayaku Kogyo Co. Ltd.), and the like. The commercially available products may be used singularly or in a mixture of two or more.

The photopolymerizable monomer may be treated with acid anhydride to improve developability.

The photosensitive resin composition may include the photopolymerizable monomer in an amount of about 1 to about 30 wt %, for example about 5 to about 20 wt %, based on the total amount (total weight) of the photosensitive resin composition for a color filter. In some embodiments, the photosensitive resin composition may include the photopolymerization monomer in an amount of about 1, 2, 3, 4, 5, 6, 7, 8, 9, 10, 11, 12, 13, 14, 15, 16, 17, 18, 19, 20, 21, 22, 23, 24, 25, 26, 26, 28, 29, or 30 wt %. Further, according to some embodiments of the present invention, the amount of the photopolymerization monomer can be in a range from about any of the foregoing amounts to about any other of the foregoing amounts.

When the photopolymerizable monomer is included in an amount within the above range, photopolymerization during exposure of a pattern forming process can be sufficiently performed, excellent reliability may be provided, heat resistance, light resistance and chemical resistance of a pattern may be improved, and resolution and a close-contacting (adhesive) force may be improved.

(C) Photopolymerization Initiator

Examples of the photopolymerization initiator may include without limitation acetophenone-based compounds, benzophenone-based compounds, thioxanthone-based compounds, benzoin-based compounds, triazine-based compounds, oxime-based compounds, and the like, and combinations thereof.

Examples of the acetophenone-based compound may include without limitation 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the benzophenone-based compound may include without limitation benzophenone, benzoyl benzoic acid, benzoyl benzoic acid methyl, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the thioxanthone-based compound may include without limitation thioxanthone, 2-chlorothioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloro methyl)-s-triazine, bis(trichloromethyl)-6-styryl-s-triazine, 2-(naphto1-yl)-4,6-bis(trichloromethyl)-s-triazine, 2-(4-methoxynaphtol-yl)-4,6-bis(trichloromethyl)-s-triazine, 2-4-trichloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may include a carbazole-based compound, a diketone-based compound, a sulfonium borate-based compound, a diazo-based compound, an imidazole-based compound, a biimidazole-based compound, and the like, and combinations thereof, in addition to or as an alternative to the aforementioned compounds.

The photosensitive resin composition may include the photopolymerization initiator in an amount of about 0.1 to about 10 wt %, for example about 1 to about 5 wt %, based on the total amount (total weight) of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts.

When the photopolymerization initiator is included in an amount within the above range, sufficient photopolymerization may be performed during exposure of a pattern-forming process, excellent reliability may be provided, heat resistance, light resistance, and chemical resistance of a pattern may be improved, resolution and a close-contacting (adhesive) force may be improved, and decrease of transmittance due to remaining non-reacted initiator after photopolymerization may be suppressed.

(D) Colorant

The colorant may include a dye, a pigment, or a combination thereof.

Examples of the pigment may include without limitation red pigments, green pigments, blue pigments, yellow pigments, black pigments, purple pigments, and the like, and combinations thereof.

Examples of the pigment may include without limitation anthraquinone-based pigments, perylene-based pigments, phthalocyanine-based pigments, azo-based pigments, and the like, which may be used singularly or in a mixture of two or more. Among them, the mixture of two or more pigments may be used to adjust maximum absorption wavelength, cross point, crosstalk, and the like.

Example of the red pigment may include without limitation dipyrrolopyrrole pigments such as C.I. red pigment 254, 255, 264, 270, 272, and the like, a pigment such as a C.I. red pigment 177, 89, and the like, and combinations thereof. Examples of the green pigment may include without limitation halogen-substituted copper phthalocyanine pigments such as C.I. green pigment 36, 7, and the like, and combinations thereof. Examples of the blue pigment may include without limitation copper phthalocyanine pigments such as C.I. blue pigment 15:6, 15, 15:1, 15:2, 15:3, 15:4, 15:5, 16, and the like, and combinations thereof. Examples of the yellow pigment may include without limitation isoindolinebased pigments such as C.I. yellow pigment 139, and the like, quinophthalone-based pigments such as C.I. yellow pigment 138, and the like, nickel complex pigments such as C.I. yellow pigment 150, and the like, and combinations thereof. Examples of the black pigment may include without limitation aniline black, perylene black, titan black, carbon black, and the like, and combinations thereof. The pigment may be used singularly or in a mixture of two or more.

A dispersing agent may be used, so that the pigment component may be uniformly dispersed in the photosensitive resin composition for a color filter.

The pigment may be included in a photosensitive resin composition for a color filter as a pigment dispersion solution, wherein the pigment dispersion solvent may include one or more solvents such as but not limited to ethylene glycol acetate, ethyl cellosolve, propylene glycol methylether acetate, ethyl lactate, polyethylene glycol, cyclohexanone, propylene glycol methyl ether, and the like, and combinations thereof.

Specifically, the pigment may be used by surface-treating the pigment with a dispersing agent, or may be used by adding the dispersing agent with the pigment during preparation of the photosensitive resin composition.

Examples of the dispersing agent may include without limitation non-ionic dispersing agents, anionic dispersing agents, cationic a dispersing agents, and the like, and combinations thereof. Examples of the dispersing agent may include without limitation polyalkyleneglycol and esters thereof, polyoxyalkylene, polyhydric alcohol ester alkylene oxide addition products, alcohol alkylene oxide addition products, sulfonate esters, sulfonate salts, carboxylate esters, carboxylate salts, alkylamide alkylene oxide addition products, alkyl amines, and the like, and they may be used singularly or in a mixture of two or more.

The photosensitive resin composition may include the dispersing agent in an amount of about 0.01 to about 15 wt % based on the total amount (total weight) of the photosensitive resin composition for a color filter. When the dispersing agent is included in an amount within the above range, the photosensitive resin composition for a color filter can have improved dispersion, and can have excellent stability, developability, and pattern.

The pigment may have an average particle diameter of about 5 to about 150 nm, for example about 10 to about 70 nm. When the pigment has an average particle diameter within the above range, a contrast ratio as well as excellent heat resistance and light resistance may be realized.

The photosensitive resin composition may include the colorant in an amount of about 1 to about 40 wt %, for example about 10 to about 40 wt %, based on the total amount (total weight) of the photosensitive resin composition for a color filter. In some embodiments, the photosensitive resin composition may include the colorant in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the colorant can be in a range from about any of the foregoing amounts to about any other of the foregoing amounts.

When the colorant such as a pigment is included in an amount within the above range, color reproducibility may be improved, and developability, curing characteristics of a pattern, and close-contacting (adhesive) force may also be improved.

(E) Solvent

The solvent has compatibility with the acrylic-based binder resin, the photopolymerizable monomer, the photopolymerization initiator, and the colorant, but does not react therewith.

Examples of the solvent may include, but are not limited to, alcohols such as methanol, ethanol, and the like; ethers such as dichloroethyl ether, n-butyl ether, diisoamyl ether, methylphenyl ether, tetrahydrofuran, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol methylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; alkyl lactate esters such as methyl lactate, ethyl lactate, and the like; alkyl hydroxyacetate esters such as methyl hydroxyacetate, ethyl hydroxyacetate, butyl hydroxyacetate, and the like; alkoxyalkyl acetate esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl esters such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; alkyl 2-hydroxy-2-methylpropionate esters such as methyl 2-hydroxy-2-methylpropionate, ethyl 2-hydroxy-2-methylpropionate, and the like; alkyl 2-alkoxy-2-methylpropionate esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; ketonic acid esters such as ethyl pyruvate, and the like, and combinations thereof. In addition, the solvent may include without limitation N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, and may be used singularly or in a mixture of two or more.

Among the solvents, considering miscibility, reactivity, and the like, the solvent may include glycol ethers such as ethylene glycol monoethyl ether, and the like; ethylene glycol alkylether acetates such as ethyl cellosolve acetate, and the like; esters such as 2-hydroxyethyl propionate, and the like; diethylene glycols such as diethylene glycol monomethyl ether, and the like; propylene glycol alkylether acetates such as propylene glycol monomethylether acetate, propylene glycol propylether acetate, and the like, and combinations thereof.

The photosensitive resin composition may include the solvent in a balance amount, for example, in an amount ranging from about 50 to about 70 wt %, based on the total amount (total weight) of the photosensitive resin composition for a color filter. In some embodiments, the photosensitive resin composition may include the solvent in an amount of about 50, 51, 52, 53, 54, 55, 56, 57, 58, 59, 60, 61, 62, 63, 64, 65, 66, 67, 68, 69, or 70 wt %. Further, according to some embodiments of the present invention, the amount of the solvent can be in a range from about any of the foregoing amounts to about any other of the foregoing amounts.

When the solvent is included in an amount within the above range, the photosensitive resin composition for a color filter may have an appropriate viscosity resulting in improvement of processibility.

(F) Other Additive(s)

The photosensitive resin composition for a color filter may further include one or more other additives. Examples of additives include without limitation malonic acid; 3-amino-1,2-propanediol; silane-based coupling agents including a vinyl group and/or a (meth)acryloxy group; leveling agents; fluorine-based surfactants; radical polymerization initiators, and the like, and combinations thereof, in order to prevent stains or spots during coating, to improve leveling performance, and/or to prevent pattern residues due to non-development.

The amount of the additive(s) may be easily adjusted by the skilled artisan depending on desired properties.

Examples of the silane-based coupling agent may include without limitation trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl) ethyltrimethoxysilane, and the like. These may be used singularly or in a mixture of two or more.

The photosensitive resin composition may include the silane-based coupling agent in an amount of about 0.01 to about 1 parts by weight, based on about 100 parts by weight of the photosensitive resin composition for a color filter.

In addition, the photosensitive resin composition for a color filter may additionally include an epoxy compound to improve the close-contacting (adhesive) force and the like, if needed.

Examples of the epoxy compound may include without limitation phenol novolac epoxy resins, tetramethyl biphenyl epoxy resins, bisphenol A epoxy resins, alicyclic epoxy resins, and the like, and combinations thereof.

The photosensitive resin composition may include the epoxy compound in an amount of about 0.01 to about 5 parts by weight, based on about 100 parts by weight of the photosensitive resin composition for a color filter. When the epoxy compound is included in an amount within the above ranges, storage, close-contacting force, and other properties may be improved.

According to one embodiment, a photosensitive resin composition for a color filter is an alkali development-type curable by radiating light and developable in an alkali aqueous solution. When the photosensitive resin composition is applied (laminated) on a substrate and radiated by (exposed to) an active ray to form a pattern for a color filter, the active ray causes a reaction, which sharply decreases solubility of a reaction region in a solvent compared with that of a non-reaction region and selectively dissolves the non-reaction region. A developing solution is used to remove the non-exposed region and can be classified as an organic solvent-type or an alkali development-type. Since the organic solvent-type solution pollutes an atmosphere and does harm to the human body, the alkali development-type solution may be advantageous. The photosensitive resin composition for a color filter according to one embodiment uses an alkali development-type solution and may be useful in terms of environment.

According to another embodiment, provided is a color filter manufactured using the photosensitive resin composition for a color filter.

The color filter may be manufactured as follows.

The above-described photosensitive resin composition can be coated on a glass substrate using an appropriate method, such as but not limited to spin-coating, roller-coating, spray-coating, and the like, to form resin composition layer having a thickness of, for example, about 0.5 to about 10 μm.

Subsequently, the substrate with the resin composition layer is radiated (exposed) to form of a pattern required for a color filter. A light source for the radiation may be a UV, an electron beam, or an X ray, for example, UV of about 190 nm to about 450 nm, for example about 200 nm to about 400 nm. The radiation process may be performed using a photoresist mask. After the radiation process, the resin composition layer that is radiated with the light source is treated with a developing solution. Herein, in the resin composition layer, a non-exposed part is dissolved to form a pattern required for a color filter. These processes are repeated depending on the necessary numbers, manufacturing a color filter having a desired pattern. In addition, the image pattern acquired by the development can be cured through heat treatment, actinic ray radiation, or the like, which can improve crack resistance, solvent resistance, and the like.

Hereinafter, the present invention is illustrated in more detail with reference to examples. These examples, however, are not in any sense to be interpreted as limiting the scope of the invention.

Preparation of Acrylic-Based Binder Resin

Preparation Example 1

A compound including a structural unit represented by the following Chemical Formula 9 is prepared by respectively putting 25 g of benzylacrylate (Sigma-Aldrich Corporation), 20 g of acrylic acid (Sigma-Aldrich Corporation), 30 g of cyclohexyl methylacrylate (Sigma-Aldrich Corporation), 15 g of epoxy methylacrylate (Sigma-Aldrich Corporation), and 10 g of diethyl methylacrylic phosphonate (Sigma-Aldrich Corporation) as a photopolymerizable monomer in a flask equipped with a cooler and an agitator and adding 10 parts by weight of 2,2-azobis(2,4-dimethylvaleronitrile) as an initiator thereto based on 100 parts by weight of the total weight of the photopolymerizable monomers and also, adding 170 parts by weight of propyleneglycol monomethyl ether acetate (PGMEA) thereto based on 100 parts by weight of the total weight of the initiator and the photopolymerizable monomer, and heating the reaction solution up to 80° C. under a nitrogen atmosphere and agitating it for 8 hour for polymerization. A weight average molecular weight of the prepared compound is 9,000 g/mol and an acid value thereof is 128 mgKOH/g.

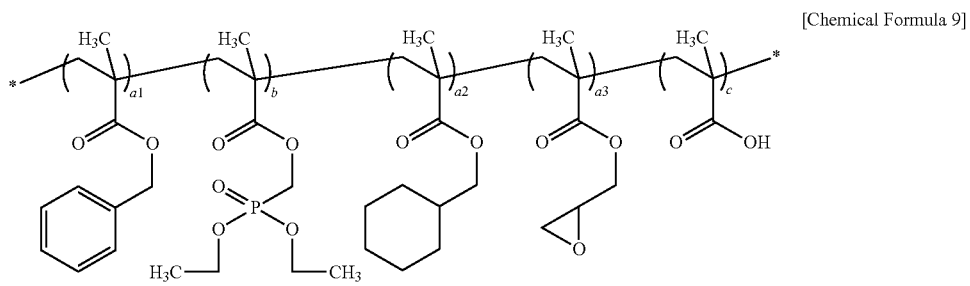

[Chemical Formula 9]

In the above Chemical Formula 9, $a^1=3$, $a^2=4$, $a^3=3$, $b=1$, and $c=6$.

Preparation of Photosensitive Resin Composition for Color Filter

Example 1 and Comparative Example 1

The following photopolymerization initiators are dissolved in the following solvents, and the solutions are agitated for 2 hours at room temperature. Then, the following acrylic-based binder resins, epoxy novolac acryl carboxylate resins, and the following photopolymerizable monomers are added thereto, and the resultant mixtures are agitated at room temperature for 2 hours. Subsequently, the following pigments are added thereto, the resultant mixtures are agitated for 1 hour at room temperature, the following surfactants are added thereto, and the mixtures are agitated for 1 hour at room temperature. The resultant solutions are three times filtered to remove impurities, preparing photosensitive resin compositions according to Example 1 and Comparative Example 1. The amounts of each component used to prepare the photosensitive resin compositions are provided in the following Table 1.

(a) Acrylic-Based Binder Resin (A-1) The acrylic-based binder resin prepared in Preparation Example 1 is used.

(A-2) A methacrylic acid/benzylmethacrylate copolymer (w/w=15/85, a weight average molecular weight of 22,000 g/mol) is used.

(B) Photopolymerizable monomer: Dipentaerythritol-hexaacrylate is used.

(C) Photopolymerization initiator: An oxime-based (CGI-124, Ciba-Geigy Corp.) compound is used.

(D) Pigment (D-1) G58 (CV7-TG2, ENF) is used.

(D-2) A Y138/G58 pigment dispersion (SFGreen/GJ1814, Sanyo Electric Co. Ltd.) is used.

(E) Solvent (E-1) Propyleneglycol monomethylether acetate is used.

(E-2) Ethyl 3-ethoxypropanoate (F) Additive (F-1) A fluorine-based surfactant (F-482, DIC Co., Ltd.) is used.

(F-2) A coupling agent (S-510, CHISSO Corporation) is used.

TABLE 1

(unit: g)

| | | Example 1 | Comparative Example 1 |
|---|---|---|---|
| (A) Acrylic-based binder resin | (A-1) | 4.50 | — |
| | (A-2) | — | 4.50 |

TABLE 1-continued (unit: g)

| | | Example 1 | Comparative Example 1 |
|---|---|---|---|
| (B) Photopolymerizable monomer | | 4.92 | 4.92 |
| (C) Photopolymerization initiator | | 1.9 | 1.9 |
| (D) Pigment | (D-1) | 20.49 | 20.49 |
| | (D-2) | 11.92 | 11.92 |
| (E) Solvent | (E-1) | 47.61 | 47.61 |
| | (E-2) | 8.57 | 8.57 |
| (F) Additive | (F-1) | 0.5 | 0.5 |
| | (F-2) | 0.09 | 0.09 |

Evaluation 1: Color Characteristics of Photosensitive Resin Composition for Color Filter The photosensitive resin compositions for a color filter Example 1 and Comparative Example 1 are spin-coated on 10×10 cm² glass substrates and pre-baked at 90° C. for 3 minutes. The pre-baked substrates are cooled down under an atmosphere and radiated by a UV ray having a wavelength of 365 nm with an exposure dose of 100 mJ/cm² to form thin films. After the radiation, the thin films are post-baked at 230° C. for 30 minutes in a forced convection drying oven, obtaining cured thin films.

The color coordinate, luminance, and contrast ratio of the cured thin films are measured, and the results are provided in the following Table 2.

(1) Thickness: Thicknesses of reference color films on glass substrates are measured by using a contact thickness gauge, Tencor, after scraping the color-measured parts with a razor.

(2) Color coordinate (Gx) and luminance (Y): A color meter (MCPD 3000, Otsuka Electronics Co., Ltd.) is used for measurement.

(3) Contrast ratio: A contrast ratio measuring instrument (CT-1, 30,000:1, Tsubosaka electronic Co., Ltd.) is used for measurement.

TABLE 2

| | Example 1 | Comparative Example 1 |
|---|---|---|
| Thickness (μm) | 2.41 | 2.41 |
| Gx | 0.2745 | 0.2743 |
| Luminance | 61.20 | 60.96 |
| Contrast ratio | 16346 | 15747 |

Referring to Table 2, the photosensitive resin composition for a color filter including an acrylic-based binder resin according to Example 1 exhibits a higher luminance and contrast ratio compared with the photosensitive resin composition for a color filter according to Comparative Example 1.

Evaluation 2: Developability of Color Filter

Each photosensitive resin composition according to Example 1 and Comparative Example 1 is respectively coated on a glass substrate with a coater made by MIKASA Co., Ltd. and dried on a hot plate at 90° C. to form films. The obtained films are radiated by a ray with an exposure dose of 50 mJ/cm² (with a reference to 365 nm), preparing specimens for evaluation. Then, the specimens are respectively developed in a 111 times-diluted solution and a 17 times-diluted solution prepared by diluting a KOH solution for 80 seconds, then, how long it takes for a non-exposed part to be completely dissolved in the developing solutions is measured, and the result is provided in following Table 3, and an image shown through the development is examined with an optical microscope, and the result is provided in FIGS. 1 and 2.

Figure 2:
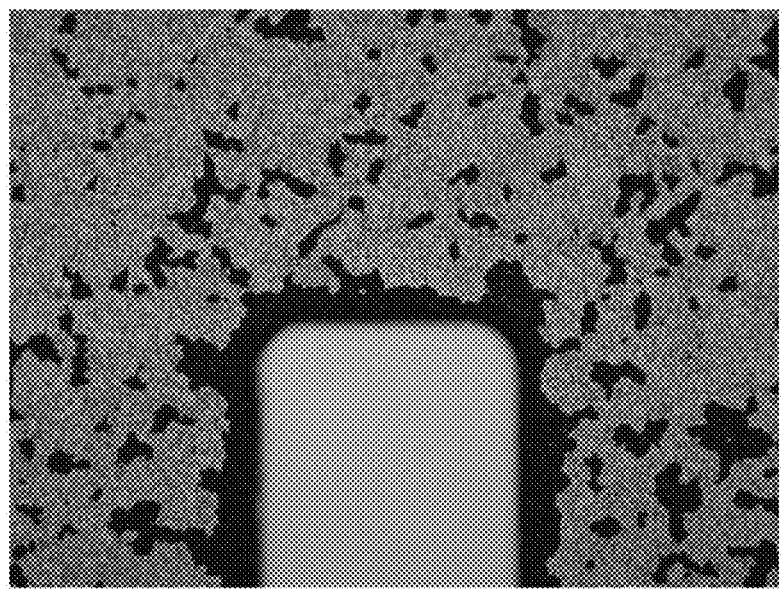
FIG. 2 is an optical microscope photograph of the color filter according to Comparative Example 1 after a development process.

FIG. 1 is an optical microscope photograph showing the color filter according to Example 1 after a development process, and FIG. 2 is an optical microscope photograph showing the color filter according to Comparative Example 1 after a development process.

Referring to FIGS. 1 and 2, the color filter using an acrylic-based binder resin according to Example 1 exhibits excellent developability compared with the film according to Comparative Example 1.

Evaluation 3: Chemical Resistance of Color Filter

Each photosensitive resin composition according to Example 1 and Comparative Example 1 is respectively coated on a glass substrate with a coater made by MIKASA Co., Ltd. and dried at 90° C. on a hot plate, obtaining films. The obtained films are exposed to light with an exposure dose of 50 mJ/cm² (with a reference to 365 nm) and then, stored in a forced convection drying furnace at 230° C. for 30 minutes, preparing specimens for evaluation. The specimens are dipped in a solvent prepared by mixing N-methylpyrrolidone (NMP), 2-butoxyethanol, and gammabutyrolactone (GBL) in a predetermined ratio at 70° C. for 5 minutes, and the color changes of the specimens are measured using a spectrometer (MCPD3000, Otsuka Electronics Co., Ltd.). The color changes (ΔEab*) are calculated according to the following Equation 1, and the results are provided in the following Table 3.

$$\Delta Eab^* = \{(\Delta L^*)^2 + (\Delta a^*)^2 + (\Delta b^*)^2\}^{1/2}$$ [Equation 1]

TABLE 3

| | Developability (sec) | | Chemical resistance |
|---|---|---|---|
| | 111 times | 175 times | (ΔEab*) |
| Example 1 | 25 | 54 | 2.35 |
| Comparative Example 1 | 36 | 66 | 4.42 |

Referring to Table 3, the composition using an acrylic-based binder resin according to Example 1 exhibits a color filter having excellent developability and chemical resistance compared with the composition according to Comparative Example 1.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
   (A) an acrylic-based binder resin including at least one repeating unit represented by the following Chemical Formula 1, at least one repeating unit represented by the following Chemical Formula 2 and at least one repeating unit represented by the following Chemical Formula 3;
   (B) a photopolymerizable monomer;
   (C) a photopolymerization initiator;
   (D) a colorant; and
   (E) a solvent:

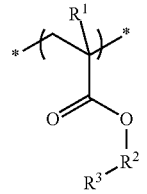

[Chemical Formula 1]

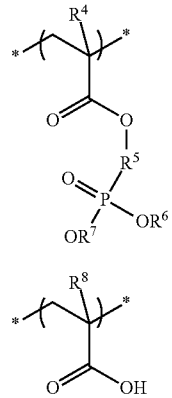

[Chemical Formula 2]

[Chemical Formula 3]

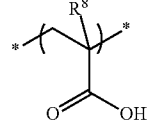

wherein, in the above Chemical Formulae 1 to 3,
$R^1$, $R^4$, and $R^8$ are the same or different and are each independently hydrogen or substituted or unsubstituted $C_1$ to $C_{10}$ alkyl,
$R^2$ is substituted or unsubstituted $C_1$ to $C_{10}$ alkylene,
$R^5$ is a single bond or substituted or unsubstituted $C_1$ to $C_{10}$ alkylene,
$R^3$ is substituted or unsubstituted $C_2$ to $C_{20}$ alkynyl, substituted or unsubstituted $C_3$ to $C_{20}$ cycloalkyl, substituted or unsubstituted $C_3$ to $C_{20}$ cycloalkenyl, substituted or unsubstituted $C_3$ to $C_{20}$ cycloalkynyl, or substituted or unsubstituted epoxy, and
$R^6$ and $R^7$ are the same or different and are each independently substituted or unsubstituted $C_1$ to $C_{20}$ alkyl, substituted or unsubstituted $C_2$ to $C_{20}$ alkenyl, substituted or unsubstituted $C_2$ to $C_{20}$ alkynyl, substituted or unsubstituted $C_3$ to $C_{20}$ cycloalkyl, substituted or unsubstituted $C_3$ to $C_{20}$ cycloalkenyl, substituted or unsubstituted $C_3$ to $C_{20}$ cycloalkynyl, or substituted or unsubstituted $C_6$ to $C_{30}$ aryl.

2. The photosensitive resin composition for a color filter of claim 1, wherein the acrylic-based binder resin comprises about 65 to about 80 mol % of the repeating unit represented by Chemical Formula 1, about 5 to about 15 mol % of the repeating unit represented by Chemical Formula 2, and about 15 to about 25 mol % of the repeating unit represented by Chemical Formula 3.

3. The photosensitive resin composition for a color filter of claim 1, wherein the acrylic-based binder resin comprises repeating units represented by the following Chemical Formulae 4 to 8:

[Chemical Formula 4]

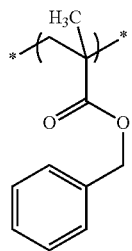

[Chemical Formula 5]

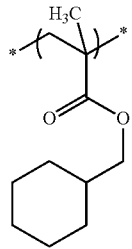

[Chemical Formula 6]

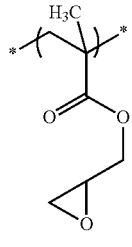

[Chemical Formula 7]

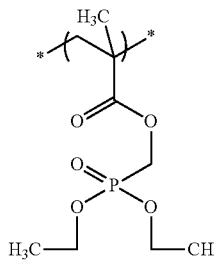

[Chemical Formula 8]

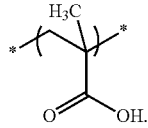

4. The photosensitive resin composition for a color filter of claim 1, wherein the acrylic-based binder resin comprises a structural unit represented by the following Chemical Formula 9:

wherein, in the above Chemical Formula 9,
$a^1$, $a^2$, $a^3$, b, and c are the same or different and are each independently integers ranging from 1 to 50.

5. The photosensitive resin composition for a color filter of claim 1, wherein the acrylic-based binder resin has a weight average molecular weight of about 6,000 to about 15,000 g/mol.

6. The photosensitive resin composition for a color filter of claim 1, wherein the colorant comprises a dye, a pigment, or a combination thereof.

7. The photosensitive resin composition for a color filter of claim 1, wherein the photosensitive resin composition for a color filter comprises:
about 1 to about 40 wt % of the acrylic-based binder resin (A);
about 1 to about 30 wt % of the photopolymerizable monomer (B);
about 0.1 to about 10 wt % of the photopolymerization initiator (C);
about 1 to about 40 wt % of the colorant (D); and
a balance amount of the solvent (E).

8. The photosensitive resin composition for a color filter of claim 1, wherein the photosensitive resin composition for a color filter further comprises malonic acid; 3-amino-1,2-propanediol; a silane-based coupling agent having a vinyl group or a (meth)acryloxy group; a leveling agent; fluorine-based surfactant; radical polymerization initiator, or a combination thereof.

9. A color filter manufactured using the photosensitive resin composition for a color filter according to claim 1.

10. The photosensitive resin composition for a color filter of claim 1, wherein the acrylic-based binder resin comprises at least one or more repeating units represented by Chemical Formula 1, wherein $R^3$ is substituted or unsubstituted $C_3$ to $C_{20}$ cycloalkyl and/or substituted or unsubstituted epoxy.

11. The photosensitive resin composition for a color filter of claim 1, wherein the acrylic-based binder resin comprises a repeating unit represented by Chemical Formula 1 wherein $R^3$ is substituted or unsubstituted $C_3$ to $C_{20}$ cycloalkyl; and a repeating unit represented by Chemical Formula 1 wherein $R^3$ is substituted or unsubstituted epoxy; and wherein the acrylic-based binder resin further comprises a repeating unit represented by the following Chemical Formula 1a:

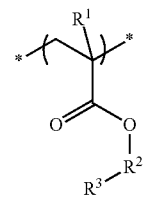

[Chemical Formula 9]

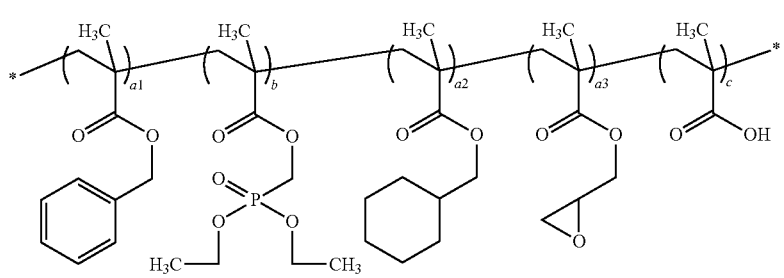

wherein $R^1$ and $R^2$ are the same as defined in claim 1 and wherein $R^3$ is substituted or unsubstituted $C_6$ to $C_{30}$ aryl.

12. The photosensitive resin composition for a color filter of claim 1, wherein the acrylic-based binder resin further comprises at least one repeating unit represented by the following Chemical Formula 1a:

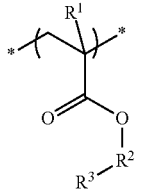

[Chemical Formula 1a]

wherein $R^1$ and $R^2$ are the same as defined in claim 1 and $R^3$ is substituted or unsubstituted $C_1$ to $C_{20}$ alkyl or substituted or unsubstituted $C_6$ to $C_{30}$ aryl.

* * * * *